(12) United States Patent
Chen et al.

(10) Patent No.: US 11,301,202 B2
(45) Date of Patent: Apr. 12, 2022

(54) ELECTRONIC DEVICE AND AUTOMATIC VOLUME-ADJUSTMENT METHOD

(71) Applicant: Acer Incorporated, New Taipei (TW)

(72) Inventors: En-Shin Chen, New Taipei (TW);
Cheng-Tse Wu, New Taipei (TW);
An-Cheng Lee, New Taipei (TW);
Ying-Shih Hung, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 99 days.

(21) Appl. No.: 16/826,476

(22) Filed: Mar. 23, 2020

(65) Prior Publication Data

US 2021/0149619 A1 May 20, 2021

(30) Foreign Application Priority Data

Nov. 14, 2019 (TW) .................................. 108141359

(51) Int. Cl.

| | |
|---|---|
| *G06F 3/16* | (2006.01) |
| *A63F 13/54* | (2014.01) |
| *G10L 25/51* | (2013.01) |
| *H03G 7/00* | (2006.01) |
| *H04R 3/00* | (2006.01) |

(52) U.S. Cl.
CPC .............. *G06F 3/165* (2013.01); *A63F 13/54* (2014.09); *G10L 25/51* (2013.01); *H03G 7/007* (2013.01); *H04R 3/00* (2013.01); *A63F 2300/6081* (2013.01); *H04R 2430/01* (2013.01)

(58) Field of Classification Search
CPC .. G06F 3/165; G06F 2300/6081; A63F 13/54; G10L 25/51; H03G 7/007; H04R 3/00; H04R 2430/01
See application file for complete search history.

(56) References Cited

U.S. PATENT DOCUMENTS

| | | | | |
|---|---|---|---|---|
| 7,164,076 B2* | 1/2007 | McHale | ................. | G10H 1/368 |
| | | | | 434/307 A |
| 7,338,373 B2* | 3/2008 | Kawamura | ............. | A63F 13/10 |
| | | | | 463/35 |
| 8,629,342 B2* | 1/2014 | Lee | ........................ | G09B 15/04 |
| | | | | 84/610 |

(Continued)

FOREIGN PATENT DOCUMENTS

| | | |
|---|---|---|
| TW | 201820315 A | 6/2018 |
| TW | 201928945 A | 7/2019 |

OTHER PUBLICATIONS

Chinese language office action dated Dec. 9, 2020, issued in application No. TW 108141359.

(Continued)

*Primary Examiner* — David L Ton
(74) *Attorney, Agent, or Firm* — McClure, Qualey & Rodack, LLP (57) ABSTRACT

An automatic adjustment method includes: recognizing whether one of a plurality of predetermined sound categories is included in audio data of current game; when one of the predetermined sound categories is included in the audio data, determining volume gain based on the predetermined sound category included in the audio data; and adjusting the volume of the audio data according to the volume gain.

16 Claims, 8 Drawing Sheets

(56) References Cited

U.S. PATENT DOCUMENTS

| | | | |
|---|---|---|---|
| 8,740,701 B2* | 6/2014 | Berry | ............... G07F 17/3225 463/35 |
| 2010/0241959 A1 | 9/2010 | Ng et al. | |
| 2015/0099584 A1 | 4/2015 | Kulavik et al. | |
| 2016/0332078 A1 | 11/2016 | Wolff-Petersen et al. | |
| 2016/0360334 A1 | 12/2016 | Wu et al. | |
| 2020/0186912 A1 | 6/2020 | Essid et al. | |
| 2020/0401364 A1 | 12/2020 | Eronen et al. | |

OTHER PUBLICATIONS

European Search Report dated Aug. 24, 2020, issued in application No. EP 20169029.4.

\* cited by examiner

ELECTRONIC DEVICE AND AUTOMATIC VOLUME-ADJUSTMENT METHOD

CROSS REFERENCE TO RELATED APPLICATIONS

This application claims priority of Taiwan Patent Application No. 108141359, filed on Nov. 14, 2019, the entirety of which is incorporated by reference herein.

BACKGROUND OF THE INVENTION

Field of the Invention

The present invention relates to the technology of volume adjustment, and more particularly to an electronic device and an automatic adjustment method that can automatically adjust the volume of a video game.

Description of the Related Art

In recent years, with the advancement of technology and the Internet, video games of various game types have also flourished. The sounds of the video game can be used to enhance interactivity with the game and create an atmosphere to bring a strong telepresence to its players. Furthermore, during the process of playing a video game, players even can make relative reactions and judgments based on certain game sounds, or on the volume of certain game sounds, so as to increase their chances of winning the game.

For example, in a first-person shooter (FPS) game, players can quickly identify the position of the enemy and the type of weapon they are using by the sound of the gunfire. Accurately determining the position and distance of the enemy at the earliest time possible will aid in mounting an effective counterattack on the enemy. Therefore, whether a player can identify certain types of sounds (for example, the sounds of gunfire, explosions, etc.) is quite important in playing video games.

BRIEF SUMMARY OF THE INVENTION

An automatic volume-adjustment method is disclosed in an embodiment of the present invention. The automatic volume-adjustment method includes: recognizing whether one of a plurality of predetermined sound categories is included in audio data of a current game; when one of the predetermined sound categories is included in the audio data, determining a volume gain according to the predetermined sound category included in the audio data; and adjusting volume of the audio data according to the volume gain.

An electronic device is disclosed in an embodiment of the present invention. The electronic device includes an audio recognition module and an audio adjustment module. The audio recognition module is used to recognize whether one of a plurality of predetermined sound categories is included in audio data of a current game. When one of the predetermined sound categories is included in the audio data, the audio adjustment module is used to determine a volume gain according to the predetermined sound category included in the audio data, and to adjust a volume of the audio data according to the volume gain.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

In order to make the above objects, features and advantages of the embodiments of the present invention easier to understand, a detailed description is given in the following embodiments with reference to the accompanying drawings.

It should be understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", etc., to modify an element does not by itself connote any priority or precedence, but are used merely as labels to distinguish the elements that have the same name.

Figure 1:
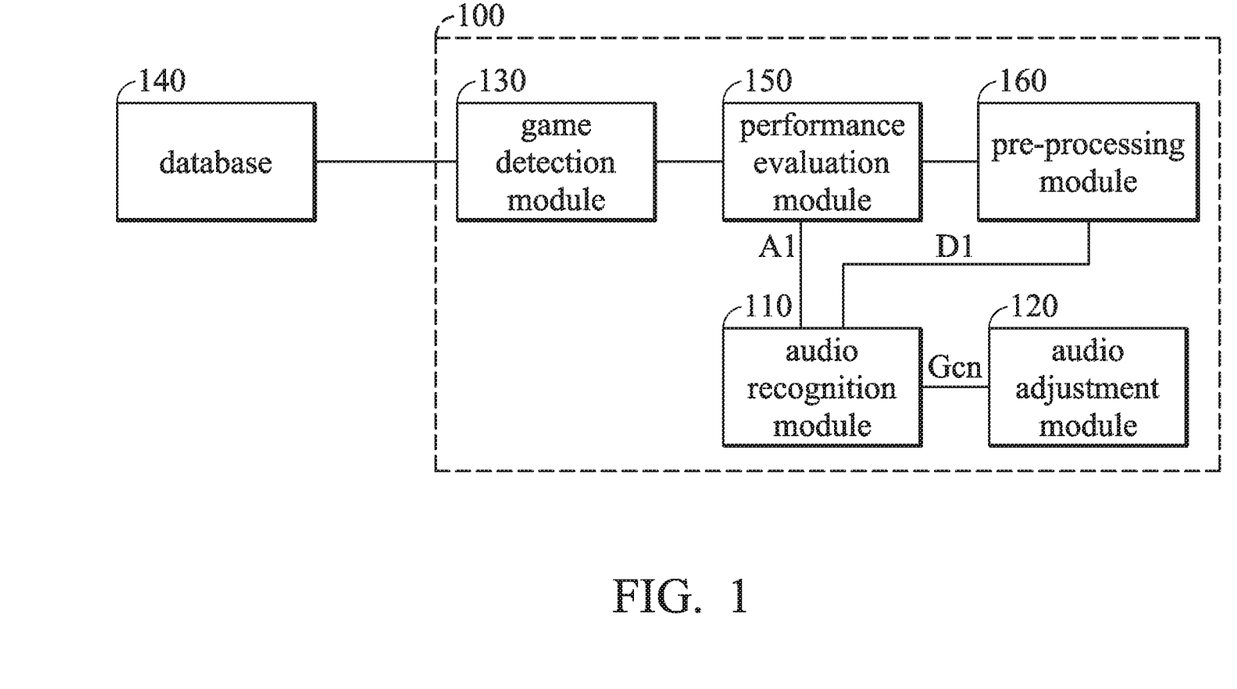
FIG. 1 is a block diagram illustrating an embodiment of an electronic device.

FIG. 1 is a block diagram illustrating an embodiment of an electronic device. In order to clarify the concept of the invention, it should be noted that FIG. 1 presents a simplified block diagram, in which only the elements relevant to the invention are shown. It will be readily appreciated by persons with ordinary skill in the art that the electronic device can certainly comprise other elements to provide specific functions.

Please refer to FIG. 1. An electronic device 100 can be used to run various software and programs, especially game software. Furthermore, a user can load the game software in the electronic device 100 to play the video game, and enjoy the visual and auditory experiences of playing the video game. In an embodiment, the electronic device 100 may include an audio recognition module 110 and an audio adjustment module 120. The audio adjustment module 120 is coupled to the audio recognition module 110. The electronic device 100 can perform an automatic volume-adjustment method to change the volume in any embodiment of the present invention, so as to automatically adjust the volume of a specific sound in a video game that matches a predetermined game type to an appropriate volume, such that the user's auditory experience can be optimized.

Figure 2:
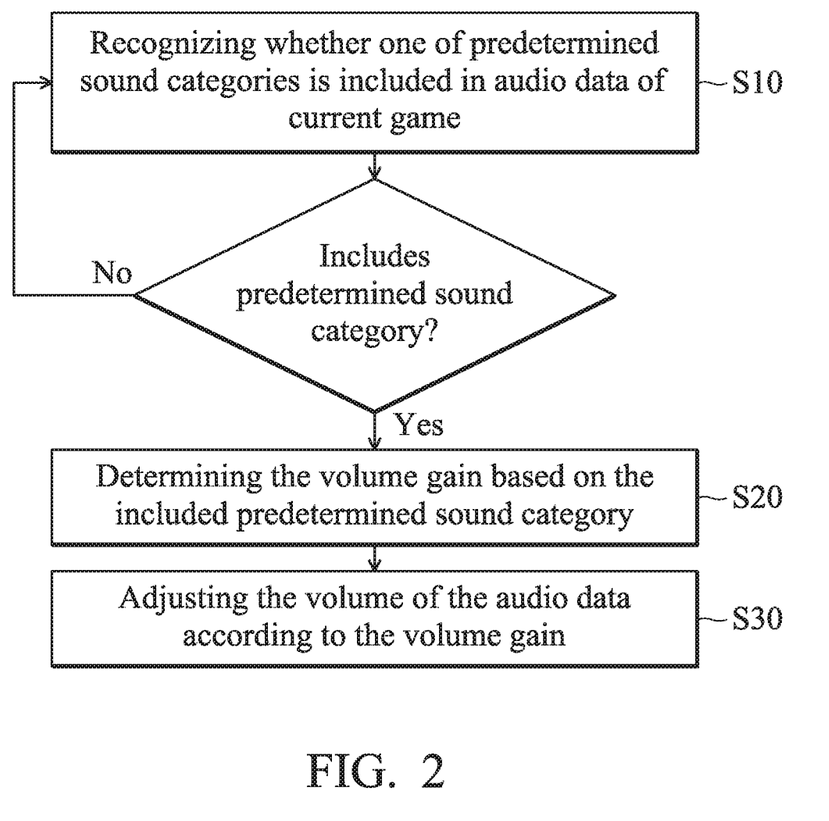
FIG. 2 is a flowchart illustrating an embodiment of the automatic volume-adjustment method.

FIG. 2 is a flowchart illustrating an embodiment of the automatic volume-adjustment method. Please refer to FIG. 1 and FIG. 2. In an embodiment of the automatic volume-adjustment method, the electronic device 100 can recognize whether one of a plurality of predetermined sound categories is included in the audio data D1 of the current game by using the audio recognition module 110 (step S10). In some embodiments, the predetermined sound categories may include gunfire sounds, explosion sounds, engine sounds, etc. However, the present invention is not limited thereto. The predetermined sound category may be set according to a sound category that the user wants to strengthen. When the audio recognition module 110 recognizes that one of the predetermined sound categories is included in this audio data D1, the electronic device 100 can determine the volume gain based on the predetermined sound category included in the audio data D1 by using the audio adjustment module 120 (step S20), and it can adjust the volume of the audio data D1 appropriately based on the volume gain by using the audio adjustment module 120 (step S30).

In this way, the sounds that match the predetermined sound categories in the current game can be appropriately adjusted, for example, the volume of the sounds of the predetermined sound categories is amplified, such that the user's mastery of sounds that match the predetermined sound categories can be higher, and it further optimizes the game experience of the user.

In some embodiments, when only one game is being run on the electronic device 100, the game may be referred to as the current game. When more than one game is being run on the electronic device 100, the game with the top-most game window may be referred to as the current game.

In some embodiments, the electronic device 100 may further include a game detection module 130, and the game detection module 130 is coupled to the audio recognition module 110. The game detection module 130 can be used to detect whether any games are currently being run on the electronic device 100. In some implementations, the game detection module 130 can automatically activate a detection function. In other implementations, the activation of the detection function of the game detection module 130 can also be controlled by the user using the application program interface.

Figure 3:
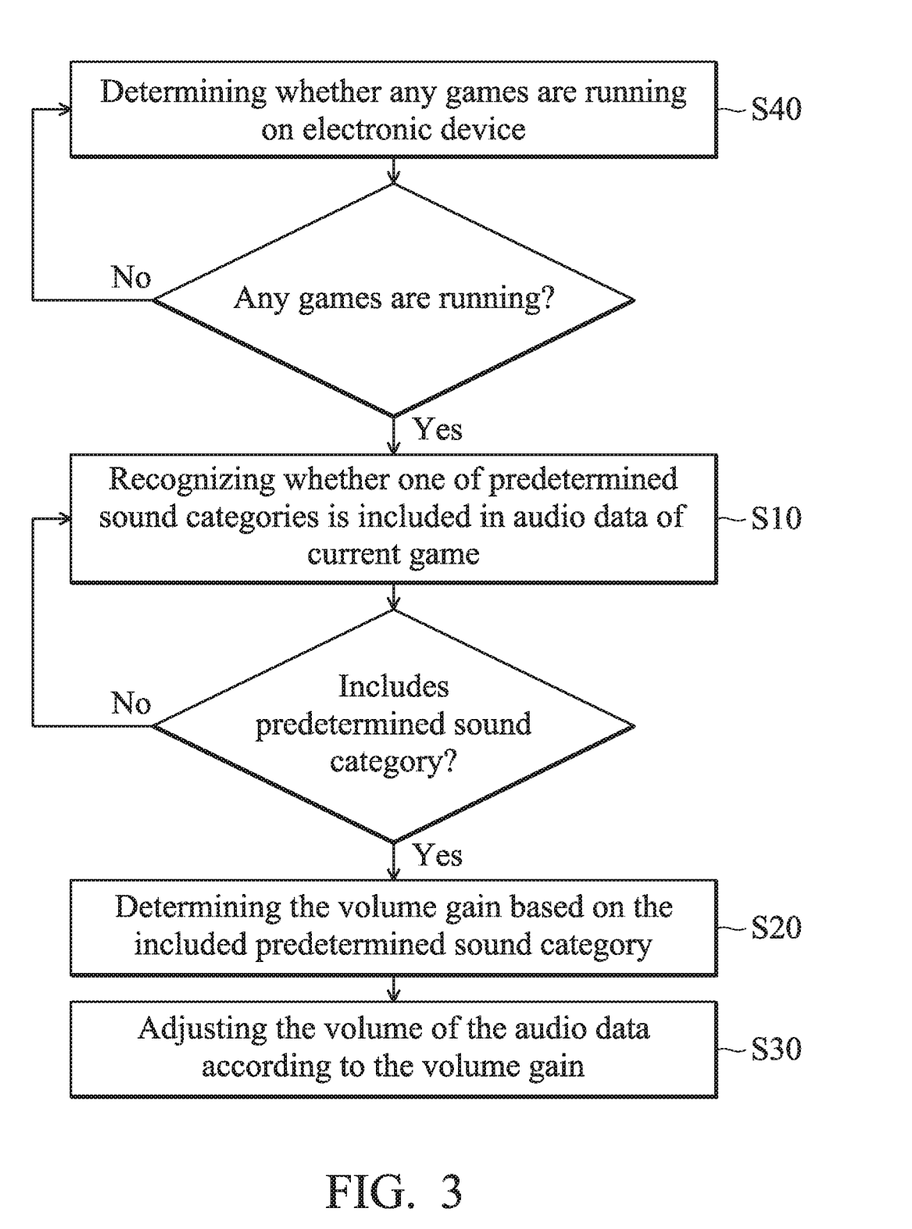
FIG. 3 is a flowchart illustrating an embodiment of the automatic volume-adjustment method.

FIG. 3 is a flowchart illustrating an embodiment of the automatic volume-adjustment method. Please refer to all the figures from FIG. 1 to FIG. 3. In an embodiment of the automatic volume-adjustment method, before step S10, the electronic device 100 can first determine whether any games are running on the electronic device 100 by using the game detection module 130 (step S40). When the game detection module 130 determines that there is a game running on the electronic device 100, the audio recognition module 130 can perform step S10 for recognizing the audio data D1 of the game (i.e., the current game), so as to confirm whether any of the predetermined sound categories is included in the audio data D1 of the current game. However, the present invention is not limited thereto. Depending on the game type, some predetermined sound categories may not be included in the audio data of certain games. For example, when the predetermined sound categories are gunfire sounds, explosion sounds and/or engine sounds and the current game is a sports game (SPT), audio data of the current game may not include any of the predetermined sound categories, and therefore the audio data herein has no need to be recognized by the audio recognition module 130. If the current game is first-person shooter (FPS) or a race car game (RCG), the audio data of the current game may contain sounds from one of the predetermined sound categories, and so the audio data of the current game needs further recognition.

Figure 4:
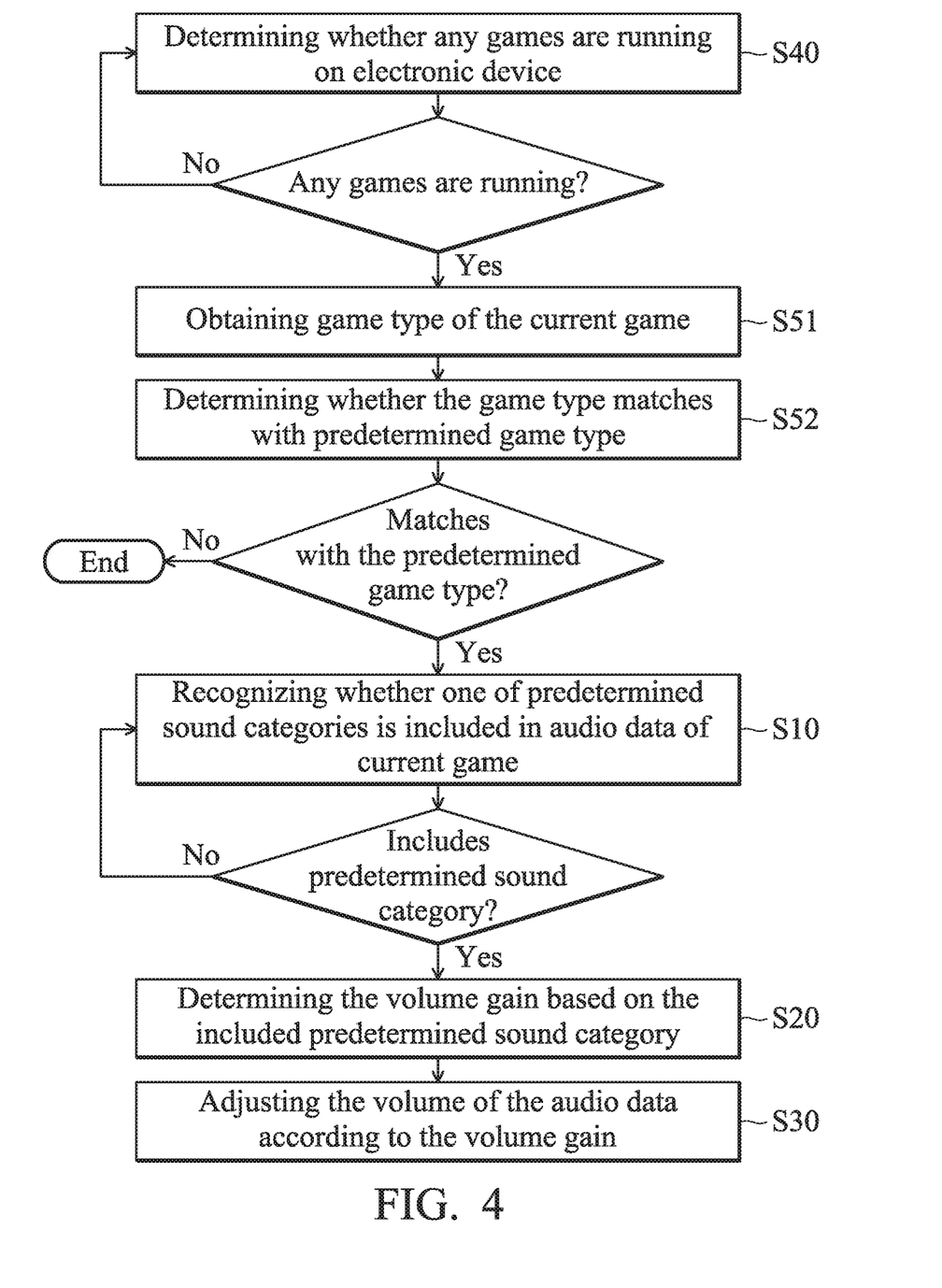
FIG. 4 is a flowchart illustrating another embodiment of the automatic volume-adjustment method.

Therefore, in another embodiment of the automatic volume-adjustment method, when the game detection module 130 determines in step S40 that there is a game running on the electronic device 100, the electronic device 100 can further determine the game type of the current game by using the game detection module 130 (step S51), and it can determine whether the game type matches a predetermined game type by using the game detection module 130 (step S52), as shown in FIG. 4. After that, when the game detection module 130 determines that the game type matches the predetermined game type, the electronic device 100 then continues to perform subsequent steps, such as step S10 in which the audio recognition module 110 is used to recognize the audio data D1 of the current game, so as to confirm whether any of the predetermined sound categories is included in this audio data D1. Conversely, when the game detection module 130 determines in step S52 that the game type does not match a predetermined game type, the electronic device 100 may not perform any subsequent steps. For example, it may not use the audio recognition module 110 to recognize the audio data D1 of the current game, to avoid wasting resources.

In some embodiments of step S40, the game detection module 130 can detect the titles of the windows operating on the electronic device 100 by using a first extraction function, and it can detect the process names of the windows by using the second extraction function. After that, the game detection module 130 can compare these titles and process names with a plurality of pre-stored titles and pre-stored process names in a database 140 to determine whether there are any games running on the electronic device 100.

In some embodiments, the pre-stored titles and the pre-stored process names in the database 140 can be obtained and stored by the game detection module 130 by using the first extraction function and the second extraction function at a previous time. However, the present invention is not limited thereto. In other embodiments, the manufacturer can store commonly used pre-stored titles and pre-stored process names in the database 140. Furthermore, the pre-stored titles and the pre-stored process names can be stored in a table in the database 140, and they can have a one-to-one relationship, as shown in Table 1, below.

TABLE 1

| pre-stored titles | pre-stored process names |
|---|---|
| Racing Classics: Drag Race Simulator | RacingClassicsDragRaceSimulator.exe |
| Team Sonic Racing ™ | TeamSonicRacing ™.exe |
| F1 2018 | F12018.exe |
| Project CARS 2 | ProjectCARS2.exe |
| GTFO | GTFO.exe |
| Splitgate: Arena Warfare | SplitgateArenaWarfare.exe |
| Black Squad | BlackSquad.exe |
| RAGE 2 | RAGE2.exe |
| NBA 2K19 | NBA2K19.exe |
| Vampyr | Vampyr.exe |
| Katana ZERO | KatanaZERO.exe |
| Death Jump | DeathJump.exe |

In some implementations, the first extraction function and the second extraction function can be functions in a DLL (Dynamic Link Library) supported by the operating system. For example, when the operating system is a Microsoft operating system, the first extraction function can include a GetForegroundWindow function, a GetWindowTextLength function, a GetWindowText function, a combination thereof or any other applicable function. The second extraction function can include a GetWindowThreadProcessId function, a GetModuleBassName function, a combination thereof or any other applicable function. Furthermore, the database 140 may store the pre-stored titles and the pre-stored process names in table format. Moreover, the database 140 may be a cloud database connected to the game detection module 130 by a remote connection. However, the present invention is not limited thereto. The database 140 may be a local database provided in the electronic device 100.

In an embodiment of step S10, the audio recognition module 110 uses a selected algorithm A1 to recognize the audio data D1. In some embodiments, the electronic device 100 further includes a performance evaluation module 150, and the performance evaluation module 150 is coupled between the game detection module 130 and the audio recognition module 110. The performance evaluation module 150 is used to evaluate computation performance of the electronic device 100, and to determine a suitable algorithm as the selected algorithm A1 used by the audio recognition module 110 from a plurality of algorithms that are predetermined, so as to ensure the real-time performance of algorithm, and avoids delaying the output of the game sounds.

Figure 5:
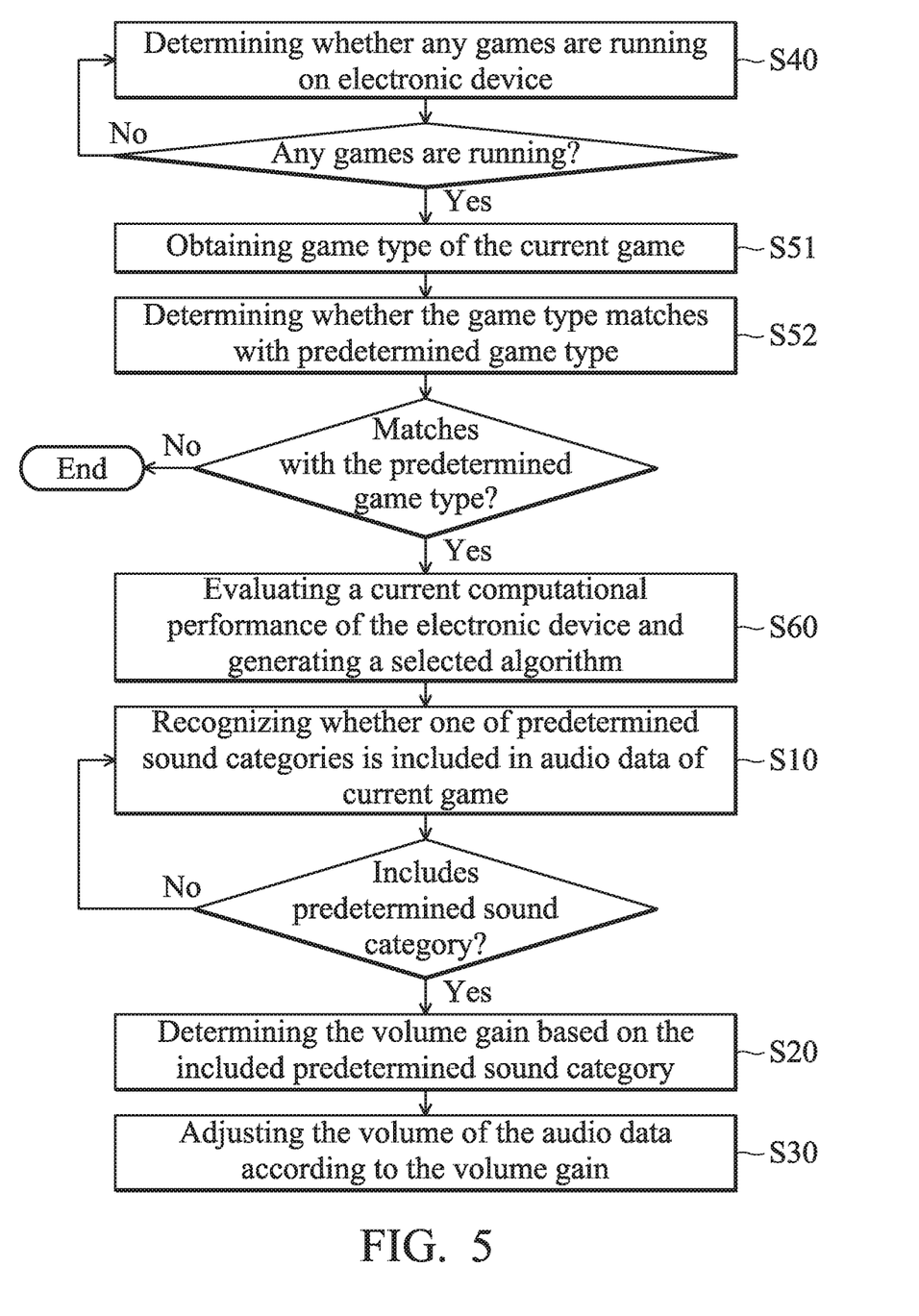
FIG. 5 is a flowchart illustrating an embodiment of the automatic volume-adjustment method.

Therefore, in an embodiment of the automatic volume-adjustment method, before step S10, the electronic device 100 can further use the performance evaluation module 150 to evaluate the current computational performance of the electronic device 100, and to generate a suitable selected algorithm A1 for the audio recognition module 110 based on the evaluation result (step S60), as shown in FIG. 5.

Figure 6:
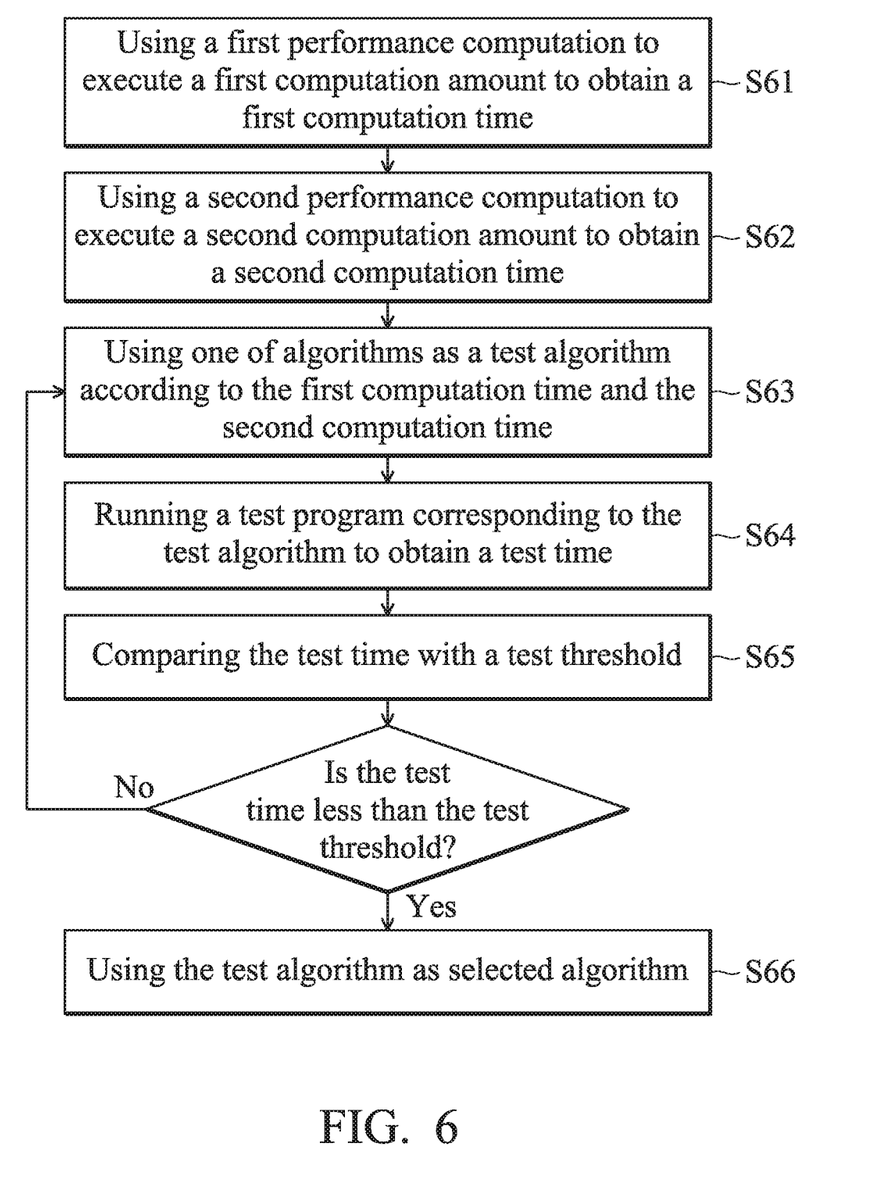
FIG. 6 is a flowchart illustrating an embodiment of step S60.

FIG. 6 is a flowchart illustrating an embodiment of step S60. Please refer to FIG. 6. In an embodiment of step S60, the performance evaluation module 150 can use a first performance computation to execute a first computation amount to obtain a first computation time (step S61), and use a second performance computation to execute a second computation amount to obtain a second computation time (step S62). Subsequently, the performance evaluation module 150 can use one of a plurality of algorithms as a test algorithm according to the first computation time and the second computation time (step S63), and run a test program corresponding to the test algorithm to determine the test time (step S64). After that, the performance evaluation module 150 can compare the test time obtained in step S64 with a test threshold which is predetermined (step S65). When the test time is shorter than the test threshold, this indicates that the delay effect caused by this test algorithm on the output of the game sound is still within a tolerance range, and the performance evaluation module 150 can use this test algorithm as a selected algorithm A1 and provides it to the audio recognition module 110 (step S66). When the test time is longer than or equal to the test threshold, this means that the delay effect on the output of the game sound caused by this test algorithm has exceed the tolerance range, and the performance evaluation module 150 can, at this time, return to step S63 to select another algorithm to use as the test algorithm, to perform the test again. These steps are repeated until the performance evaluation module 150 can finally determine the selected algorithm A1.

In an embodiment of step S63, each algorithm has a first computation time threshold corresponding to the first performance computation and a second computation time threshold corresponding to the second performance computation. The performance evaluation module 150 can compare the first computation time obtained in step S61 with the first computation time threshold of an algorithm, and compare the second computation time obtained in step S62 with the second computation time threshold of this algorithm, so as to confirm whether to select this algorithm as the test algorithm. Herein, when the performance evaluation module 150 determines that the first computation time is less than the first computation time threshold of this algorithm and the second computation time is also less than the second computation time threshold of this algorithm, the performance evaluation module 150 then selects this algorithm as the test algorithm. Conversely, the performance evaluation module 150 continues to compare the first computation time and the second computation time with a first computation time threshold and a second computation time threshold of another algorithm, and so forth, finally determines out the test algorithm.

In some embodiments, the sequence of step S61 and step S62 are interchangeable. The first performance computation may be a floating-point operation, and the second computation may be an integer operation. Furthermore, the first computation amount may be equal to the second computation amount, and the first computation amount and the second computation amount may be fixed amount preset by a user or a manufacturer, but the present invention is not limited thereto.

In some embodiments, the core technologies of the algorithms may separately include artificial intelligence (e.g., deep neural network), statistical models (e.g., hidden Markov models), cluster analysis (e.g., K-means), etc., but the present invention is not limited thereto.

In an embodiment of step S10, the audio recognition module 110 uses the selected algorithm A1 to recognize a plurality of frames in the audio data D1. In some embodiments, the electronic device 100 may further include a pre-processing module 160, and the pre-processing module 160 is coupled to the audio recognition module 110. The pre-processing module 160 can be used to obtain the audio data D1 of the current game, and to appropriately pre-process the audio data D1 to ensure that the extracted audio data D1 can be analyzed effectively.

Therefore, in an embodiment of the automatic volume-adjustment method, the electronic device 100 can use the pre-processing module 160 to obtain the audio data D1 from the frontend (step S71), for example, from audio driver, and to retrieve a plurality of frames from the audio data D1 (step S72). After that, the pre-processing module 160 can appropriately pre-process these frames to obtain the characteristic coefficients of each frame (step S73), and after the pre-processing, it can output the characteristic coefficients of each frame to the audio recognition module 110 (step S74), so as to perform step S10. It should be noted that, although step S40, step S51, and step S52 are not shown in FIG. 7, step S40, step S51, and step S52 may be combined into the flow shown in FIG. 7.

Figure 7:
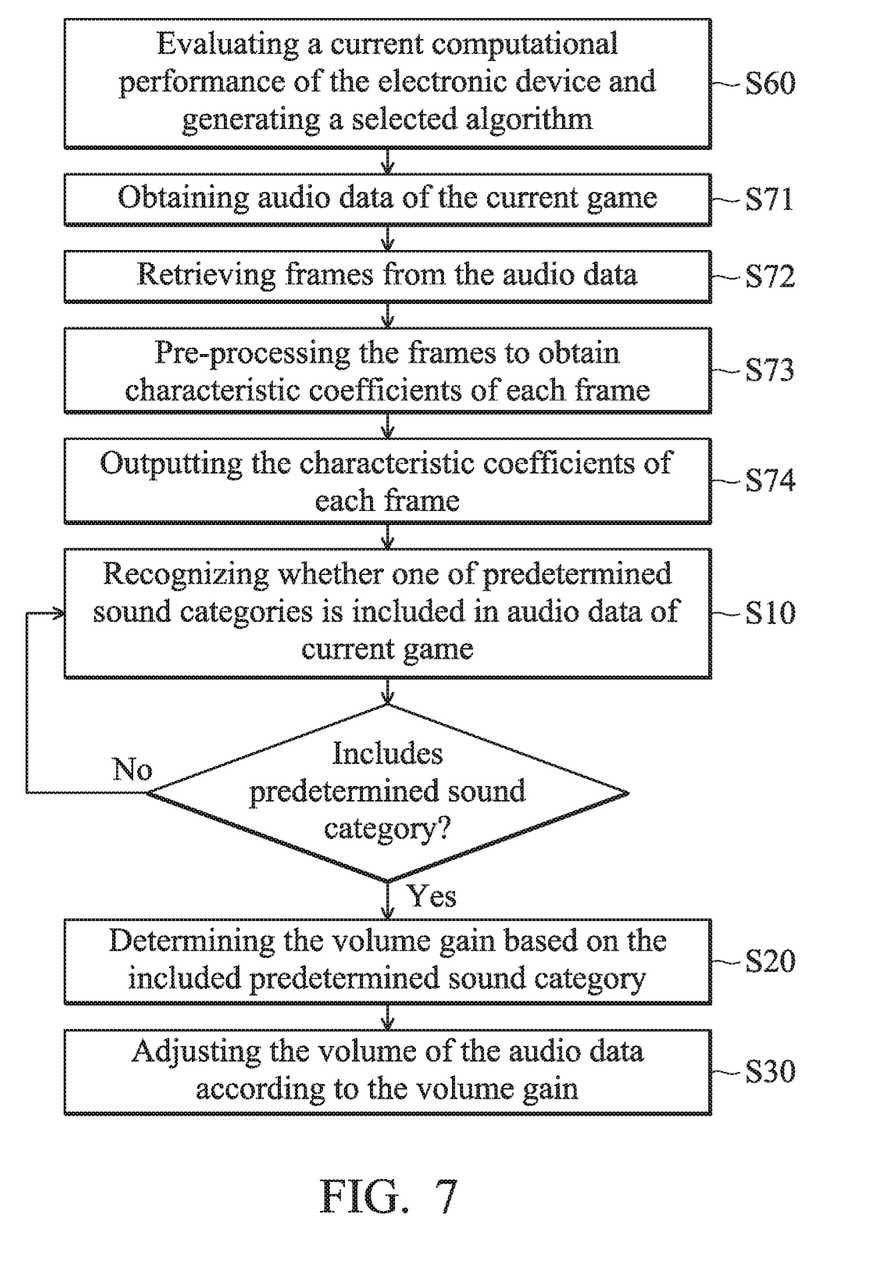
FIG. 7 is a flowchart illustrating an embodiment of the automatic volume-adjustment method.

In an embodiment of step S72, every first number of sampling points, the pre-processing module 160 can retrieve a second number of sampling points from the audio data D1 to be a frame (i.e., one analysis unit). In other words, the frames retrieved by the pre-processing module 160 are sequentially spaced apart from each other by the first number of sampling points, and each of the frames includes the second number of sampling points. In some implementations, the first number may be 192, and the second number may be 256. However, the present invention is not limited thereto. The first number and the second number may be other appropriate values.

In an embodiment of step S73, the pre-process may include using Fourier transformation to transform each frame from a time domain to a frequency domain. Furthermore, the pre-process may further include using coefficient conversion to convert each frame which has been transformed to the frequency domain into characteristic coefficients with representative, such as Mel-Frequency Cepstral Coefficients, but the present invention is not limited thereto.

Please refer to all the figures from FIG. 1 to FIG. 7. In an embodiment of step S10, the audio recognition module 110 can feed the characteristic coefficients generated by the pre-processing module 160 to the selected algorithm A1 determined by the performance evaluation module 150, so as to separately recognize whether each of the frames in the audio data D1 includes one of the predetermined sound categories. The current frame is the frame being processed by the audio recognition module 110.

In an embodiment of step S20, when one of the predetermined sound categories is included in the current frame, the audio adjustment module 120 can further obtain a plurality of estimated gains of a plurality of previous frames and the current frame. Wherein, the previous frames refer to the frames that appear earlier than the current frame. Furthermore, the previous frames and the current frame can separately correspond to one of the estimated gains, and also separately correspond to one gain adjustment coefficient. Herein, the audio adjustment module 120 can separately calculate products of estimated gain of each previous frame and gain adjustment coefficient corresponding to each previous frame, calculate product of estimated gain of current frame and gain adjustment coefficient corresponding to the current frame, and then add them up to obtain a volume gain of the current frame.

In some embodiments, the volume gain of the current frame can be expressed by the following formula 1:

$$G_i = \sum_{j=0}^{x-1} C_j \times G_{p(i-j)} \qquad \text{(formula 1)}$$

Wherein, $G_i$ is a volume gain of a current frame, $C_j$ is a gain adjustment coefficient, and $G_{p(i-j)}$ is an estimated gain of the (i-j)-th frame. Furthermore, x is the amount of frames to be considered. For example, when x is equal to 5, this indicates that the four previous frames are further considered from the current frame which is currently being processed.

In some embodiments, since the values observed more recently are more representative, these gain adjustment coefficients corresponding to the previous frames and the current frame can be an increasing sequence (wherein, the gain adjustment coefficient corresponding to the earliest of the previous frames is the smallest, and the gain adjustment coefficient corresponding to the current frame is the largest) to adjust volume in a gradual manner. In some implementations, the sum of these gain adjustment coefficients may equal one.

In some embodiments, if a frame does not include sounds of any of the predetermined sound categories, the estimated gain of the frame is zero. If the sounds of any of the predetermined sound categories are included in a frame, the estimated gain of that frame is mainly related to the included predetermined sound category. Further details of how to obtain an estimation of the estimated gain of each frame will be provided later.

In the following paragraphs, one embodiment consisting of five frames (i.e., four previous frames and one current frame) is used to explain how to calculate the volume gain of the current frame. However, the amount of frames is not limited thereto. In an embodiment, an example of the estimated gain and the gain adjustment coefficient corresponding to each frame is shown in Table 2 below.

TABLE 2

| Frame | Estimated Gain | Gain Adjustment Coefficient | Coefficient Value |
|---|---|---|---|
| G4 | 2 (gunfire sounds) | C0 | 0.7 |
| G3 | 2 (gunfire sounds) | C1 | 0.2 |
| G2 | 0 (none of predetermined sound categories is included in this frame) | C2 | 0.05 |
| G1 | 0 (none of predetermined sound categories is included in this frame) | C3 | 0.03 |
| G0 | 0 (none of predetermined sound categories is included in this frame) | C4 | 0.02 |

In this embodiment, the audio adjustment module 120 can bring the values shown in Table 2 into the formula to obtain that the volume gain of the current frame is 1.8. The calculation is as follows: (2*0.7)+(2*0.2)+(0*0.05)+(0*0.03)+(0*0.02)=1.8.

In some embodiments, each of the predetermined sound categories has a corresponding average recognition rate and a custom gain Gcn. Wherein, the value of the average recognition rates can be obtained at the time to feed test database to audio recognition module 110 for training the algorithms of the audio recognition module 110. The custom gain Gcn of each predetermined sound category may be a preset gain value set by the user via the application program interface. Furthermore, each of the frames has a corresponding confidence score. The confidence score of i-th frame is generated by the audio recognition module 110 when the i-th frame is recognized.

In some embodiments, when the sounds of any predetermined sound category are included in the frame (the current frame or the previous frame), the audio adjustment module 120 can first subtract 1 from the custom gain Gcn of the predetermined sound category which is included by this frame, and then multiply it by the average recognition rate of the predetermined sound category, which is included by this frame, and by the confidence score of this frame, and finally add 1 to the product to obtain the estimated gain of this frame.

In some embodiments, the estimated gain of a frame which includes any predetermined sound category can be expressed by formula 2, below:

$$G_{pi} = 1 + G_{rn} \times G_{di} \times (G_{cn} - 1) \qquad \text{(formula 2)}$$

Wherein, $G_{pi}$ is a estimated gain of the i-th frame, $G_{rn}$ is an average recognition rate of the n-th predetermined sound category, $G_{di}$ is a confidence score of the i-th frame, and $G_{cn}$ is a custom gain of the n-th predetermined sound category.

In some embodiments, the selected algorithm A1 used by the audio recognition module 110 may not automatically generate a corresponding confidence score. For example, when the selected algorithm A1 is an algorithm with artificial intelligence or statistical model as its core technology, the selected algorithm A1 can generate corresponding confidence score according to each recognition result. However, when the selected algorithm A1 is an algorithm with cluster analysis as its core technology, it is predetermined that the selected algorithm A1 will not automatically generate corresponding confidence score. Therefore, in the case that the corresponding confidence score will not be automatically generated, the audio adjustment module 120 can further calculate the confidence score using formula 3, below:

$$G_{di} = 1 - \frac{\text{Min}(D_l)}{\sum_{l=1}^{k} D_l} \qquad \text{(formula 3)}$$

Wherein, $G_{di}$ is a confidence score of a i-th frame, and $D_1$ is an Euclidean distance between an audio sample and the first one predetermined sound category.

In an embodiment of step S30, the audio adjustment module 120 can use a Sigmoid function to generate an output volume according to an input volume of the current frame, an input adjustment coefficient, an audio maximum output value and a volume gain which is obtained in step S20. After that, the audio adjustment module 120 can adjust the volume of the current frame according to the output volume generated by the Sigmoid function. Wherein, the audio maximum output value refers to the maximum output value of an audio driver. For example, when an audio processor of the electronic device 100 is 8-bits, its output range can range from −128 to +127, and the audio maximum output value can be 127. Furthermore, the input adjustment coefficient is used to make the output range of the Sigmoid function to match with the requirement more. In some embodiments, due to the characteristics of the Sigmoid function, its output saturation region is approximately at the region where the input is ±0.5. Therefore, the input adjustment coefficient can be set to 0.2 (output/input=⅕=0.2).

Figure 8:
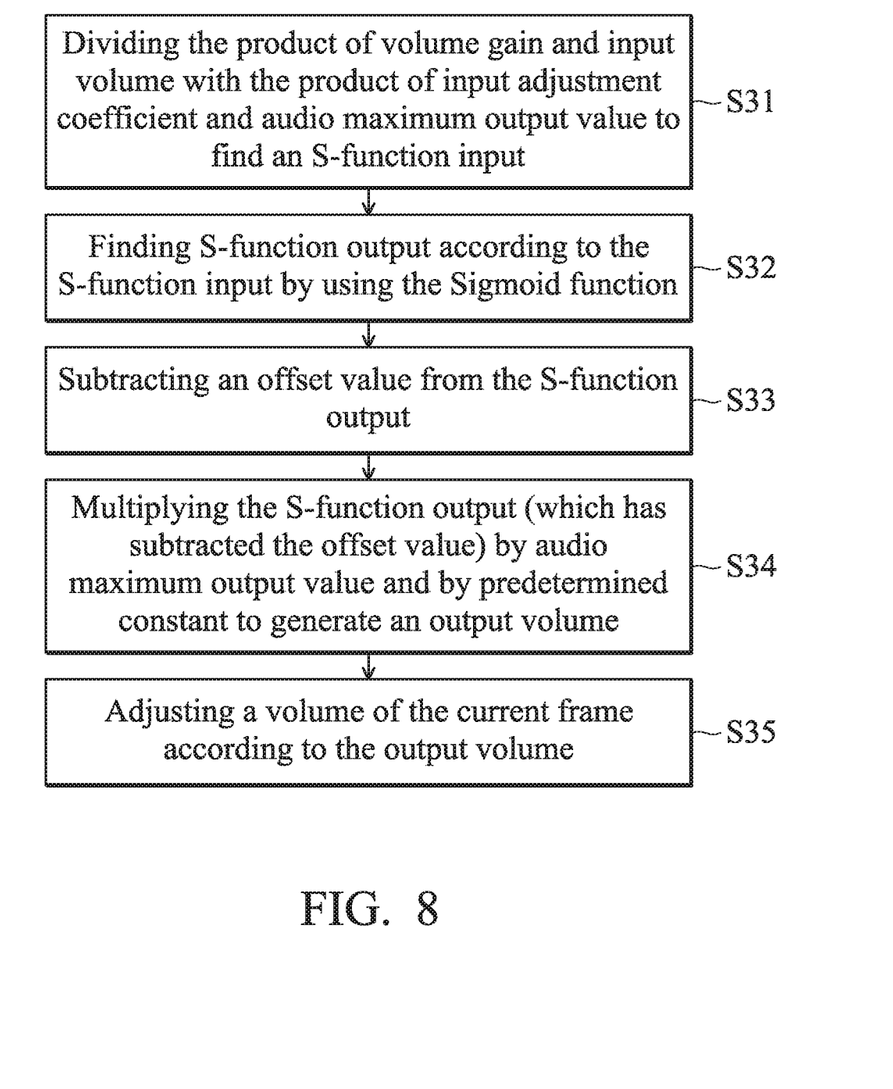
FIG. 8 is a flowchart illustrating an embodiment of step S30.

FIG. 8 is a flowchart illustrating an embodiment of step S30. Please refer to FIG. 8. In an embodiment of step S30, the audio adjustment module 120 can first divide the product of volume gain and the input volume with the product of the input adjustment coefficient and the audio maximum output value to find an S-function input (step S31). Subsequently, the audio adjustment module 120 can find the S-function output according to the S-function input by using the Sigmoid function (step S32). In order to cancel an output offset of the Sigmoid function, the audio adjustment module 120 can further subtract an offset value from the S-function output obtained in step S32 (step S33). After that, the audio adjustment module 120 multiplies the S-function output (which has subtracted the offset value) by an audio maximum output value and by a predetermined constant to generate the output volume (step S34), and the audio adjustment module 120 further adjusts the volume of the current frame according to the output volume obtained in step S34 (step S35).

In some implementations, due to the characteristics of the Sigmoid function, if an input is zero, an output will be 0.5. Therefore, the offset value in step S33 can be set to 0.5 for cancelling the output offset. Furthermore, since the maximum value output by the Sigmoid function is 1, and the offset value has been set to 0.5, the predetermined constant in step S34 can be set to 2.

In some embodiments, an output volume can be expressed by the following formula 4:

$$S_{out} = 2 \times C_m \left( \text{Sigmoid}\left( \frac{G_i \times S_{in}}{K \times C_m} \right) - C_a \right) \qquad \text{(formula 4)}$$

Wherein, $S_{out}$ is an output volume, $C_m$ is an audio maximum output value, $G_i$ is a volume gain, $S_{in}$ is an input volume, $K$ is an input adjustment coefficient, and $C_a$ is an offset value.

In the following, an example is used to explain the calculation of the output volume. In an embodiment, it is assumed that the input volume is 60, the volume gain is 1.8 (this can be obtained using formula 2), the audio maximum output value is 127, the input adjustment coefficient is 0.2 and the offset value is 0.5, the audio adjustment module 120 can first obtain the S-function input is 4.25

$$\left( \text{i.e.,} \ \frac{1.8 \times 60}{0.2 \times 127} \right).$$

Subsequently, the audio adjustment module 120 can bring 4.25 into the Sigmoid function, and obtains the S-function output to be 0.9859. After that, the audio adjustment module 120 can bring 0.9859 into formula 4, and obtains the output volume to be 123.41 (i.e., 2×127×(0.9859−0.5)=123.41). Based on this, it can be seen that the volume after being processed by an embodiment of the automatic volume-adjustment method and electronic device thereof can be adjusted from 60 to 123.41. It should be noted that, since the output volume in the present invention can be generated using the special calculation formula, poor user experience caused by recognition errors and sudden amplification can be avoided.

For any one embodiment of the automatic volume-adjustment method and electronic device thereof of the present invention, game sounds in any dimension, such as 1D, 2D, 3D, etc., are all applicable. Furthermore, the applying time of any one embodiment of the automatic volume-adjustment method and electronic device thereof of the present invention can be after the game sounds are synthesized and/or before the game sounds being played. Moreover, the adjustment of any one embodiment of the automatic volume-adjustment method and electronic device thereof of the present invention mainly adjusts the volume according to the predetermined sound category included in the game sounds.

In some embodiments, the functions of each module, such as the audio recognition module 110, the audio adjustment module 120, the game detection module 130, the performance evaluation module 150 and the pre-processing module 160 may be realized by a CPU (Central Processing Unit) and/or GPU (Graphic Processing Unit), but the present invention is not limited thereto.

As described above, any one embodiment of the present invention provides an automatic volume-adjustment method and an electronic device thereof that can analyze the audio data of the current game in real time. When recognizing that a predetermined sound category is included in the audio data of the current game, any one embodiment of the automatic volume-adjustment method and the electronic device thereof of the present invention can obtain corresponding volume gain according to the included predetermined sound category, and appropriately adjust the volume of the audio data according to the volume gain, such that the user's mastery of sounds that match the predetermined sound categories can be higher, and it further optimizes the game experience of the user. Furthermore, any one embodiment of the automatic volume-adjustment method and the electronic device thereof of the present invention can select an appropriate selected algorithm to analyze the audio data according to the current computational performance of the electronic device. Moreover, any one embodiment of the automatic volume-adjustment method and the electronic device thereof of the present invention can use the special calculation formula to prevent poor user experience caused by recognition error or sudden amplification.

The features of the embodiments described above will allow persons having ordinary skill in the art to clearly appreciate the form of the present specification. Persons having ordinary skill in the art will appreciate that the objectives and/or the advantages of the above embodiments can be accomplished in a way that is consistent with the above embodiments by designing or modifying other processes and structures based on the content of the present disclosure. Persons having ordinary skill in the art will also appreciate that equivalent constructions can be modified, substituted or retouched without departing from the scope and spirit of the present invention.

What is claimed is:

1. An automatic volume-adjustment method, comprising:
    recognizing whether one of a plurality of predetermined sound categories is included in audio data of a current game;
    when one of the predetermined sound categories is included in the audio data, determining a volume gain based on the predetermined sound category included in the audio data;
    adjusting a volume of the audio data according to the volume gain;
    using a first performance computation to execute a first computation amount to obtain a first computation time;
    using a second performance computation to execute a second computation amount to obtain a second computation time;
    using one of a plurality of algorithms as a test algorithm according to the first computation time and the second computation time;
    running a test program corresponding to the test algorithm to obtain a test time; and
    when the test time is less than a test threshold, using the test algorithm as a selected algorithm, wherein the step of recognizing is performed by using the selected algorithm.

2. The automatic volume-adjustment method as claimed in claim 1, further comprising:
    obtaining a game type of the current game; and
    determining whether the game type matches a predetermined game type, wherein the step of recognizing is performed after determining that the game type matches the predetermined game type.

3. The automatic volume-adjustment method as claimed in claim 1, further comprising:
    obtaining the audio data of the current game; and
    retrieving a plurality of frames from the audio data, wherein the frames are sequentially spaced apart from each other by a first number of sampling points, and each of the frames comprises a second number of sampling points, wherein the step of recognizing comprises: using one of the frames as a current frame; and recognizing whether one of the predetermined sound categories is included in the current frame.

4. The automatic volume-adjustment method as claimed in claim 3, wherein the step of determining the volume gain comprises:
    when one of the predetermined sound categories is included in the current frame, obtaining a plurality of estimated gains of a plurality of previous frames and the current frame, wherein the previous frames are earlier frames than the current frame, and each of the previous frames and the current frame respectively corresponds to a gain adjustment coefficient; and
    determining the volume gain of the current frame by adding up the products of the estimated gain of each of the previous frames and the corresponding gain adjustment coefficient with the product of the estimated gain of the current frame and the corresponding gain adjustment coefficient.

5. The automatic volume-adjustment method as claimed in claim 4, wherein the sum of the gain adjustment coefficients is equal to 1.

6. The automatic volume-adjustment method as claimed in claim 4, wherein each of the predetermined sound categories has an average recognition rate and a custom gain, and each of the frames has a confidence score, wherein the estimated gain of the previous frame which comprises one of the predetermined sound categories and the estimated gain of the current frame are separately generated by subtracting 1 from the custom gain, multiplying this by the average recognition rate and by the confidence score, and then adding 1 to the product, wherein the estimated gain of the previous frame which comprises none of the predetermined sound categories is zero.

7. The automatic volume-adjustment method as claimed in claim 1, wherein the step of adjusting the volume of the audio data according to the volume gain comprises:
    generating an output volume by using a Sigmoid function based on an input volume of a current frame in the audio data, an input adjustment coefficient, an audio maximum output value, and the volume gain; and
    adjusting the volume of the current frame in the audio data according to the output volume.

8. The automatic volume-adjustment method as claimed in claim 7, wherein the step of generating the output volume comprises:
    dividing the product of the volume gain and the input volume by the product of the input adjustment coefficient and the audio maximum output value to find an S-function input;
    finding S-function output by using the Sigmoid function based on the S-function input;
    subtracting an offset value from the S-function output; and
    multiplying the S-function output, from which the offset value has been subtracted, by the audio maximum output value and by a predetermined constant to generate the output volume.

9. An electronic device, comprising:
    an audio recognition module, configured to recognize whether one of a plurality of predetermined sound categories is included in audio data of a current game; and
    an audio adjustment module, configured to determine a volume gain based on the predetermined sound category included in the audio data when one of the predetermined sound categories is included in the audio data, and to adjust a volume of the audio data according to the volume gain; and
    a performance evaluation module, configured to use a first performance computation to execute a first computation amount to obtain a first computation time, and to use a second performance computation to execute a second computation amount to obtain a second computation time, wherein the performance evaluation module uses one of a plurality of algorithms as a test algorithm according to the first computation time and the second computation time, and the performance evaluation module runs a test program corresponding to the test algorithm to obtain a test time, wherein the performance evaluation module uses the test algorithm as a selected algorithm when the test time is less than a test threshold, and wherein the audio recognition module uses the selected algorithm to recognize the audio data.

10. The electronic device as claimed in claim 9, further comprising:
a game detection module, configured to obtain a game type of the current game, and to determine whether the game type matches a predetermined game type, wherein the audio recognition module recognizes the audio data of the current game after the game detection module determines that the game type matches the predetermined game type.

11. The electronic device as claimed in claim 9, further comprising:
a pre-processing module, configured to obtain the audio data of the current game, and to retrieve a plurality of frames from the audio data, wherein the frames are sequentially spaced apart from each other by a first number of sampling points, and each of the frames comprises a second number of sampling points, and wherein the audio recognition module uses one of the frames as a current frame and recognizes whether one of the predetermined sound categories is comprised in the current frame.

12. The electronic device as claimed in claim 11, wherein when one of the predetermined sound categories is included in the current frame, the audio adjustment module further obtains a plurality of estimated gains of a plurality of previous frames and the current frame, wherein the previous frames are earlier frames than the current frame, and each of the previous frames and the current frame respectively corresponds to a gain adjustment coefficient, and wherein the audio adjustment module determines the volume gain of the current frame by adding up the products of the estimated gain of each of the previous frames and the corresponding gain adjustment coefficient with the product of the estimated gain of the current frame and the corresponding gain adjustment coefficient.

13. The electronic device as claimed in claim 12, wherein the sum of the gain adjustment coefficients is equal to 1.

14. The electronic device as claimed in claim 12, wherein each of the predetermined sound categories has an average recognition rate and a custom gain, and each of the frames has a confidence score, wherein the audio adjustment module separately generates the estimated gain of the previous frame which comprises one of the predetermined sound categories and the estimated gain of the current frame by subtracting 1 from the custom gain, multiplying this by the average recognition rate and by the confidence score, and then adding 1 to the product, wherein the estimated gain of the previous frame which comprises none of the predetermined sound categories is zero.

15. The electronic device as claimed in claim 9, wherein the audio adjustment module further generates an output volume by using a Sigmoid function based on an input volume of a current frame in the audio data, an input adjustment coefficient, an audio maximum output value and the volume gain, and wherein the audio adjustment module adjusts the volume of the current frame in the audio data according to the output volume.

16. The electronic device as claimed in claim 15, wherein the audio adjustment module divides the product of the volume gain and the input volume by the product of the input adjustment coefficient and the audio maximum output value to find an S-function input, and finds S-function output by using the Sigmoid function based on the S-function input, the audio adjustment module further subtracts an offset value from the S-function output, and multiplies the S-function output, from which the offset value has been subtracted, by the audio maximum output value and by a predetermined constant to generate the output volume.

* * * * *